US012749551B2

(12) United States Patent
Ka

(10) Patent No.: US 12,749,551 B2
(45) Date of Patent: Sep. 29, 2026

(54) SEMICONDUCTOR SYSTEM FOR DETECTING FAIL LOCATION

(71) Applicant: SK hynix Inc., Icheon-si (KR)

(72) Inventor: Dong Yoon Ka, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 113 days.

(21) Appl. No.: 18/596,939

(22) Filed: Mar. 6, 2024

(65) Prior Publication Data

US 2025/0140333 A1 May 1, 2025

(30) Foreign Application Priority Data

Oct. 27, 2023 (KR) ........................ 10-2023-0145904

(51) Int. Cl.
*G11C 29/12* (2006.01)
*G11C 29/18* (2006.01)
*G11C 29/36* (2006.01)

(52) U.S. Cl.
CPC .......... *G11C 29/36* (2013.01); *G11C 29/1201* (2013.01); *G11C 29/18* (2013.01)

(58) Field of Classification Search
CPC ..... G11C 29/36; G11C 29/1201; G11C 29/18; G11C 29/10; G11C 2029/3602; G11C 29/38; G11C 29/42; G11C 29/025; G11C 29/56004
See application file for complete search history.

(56) References Cited

U.S. PATENT DOCUMENTS

2015/0356047 A1 12/2015 Ayyapureddi et al.
2018/0293128 A1* 10/2018 Dono .................. G06F 11/1004
2023/0268021 A1* 8/2023 Wei .................... G11C 29/1201 365/201

FOREIGN PATENT DOCUMENTS

KR 1020200011216 A 2/2020

* cited by examiner

*Primary Examiner* — Mohammed A Bashar
(74) *Attorney, Agent, or Firm* — WILLIAM PARK AND ASSOCIATES LTD.

(57) ABSTRACT

A semiconductor device includes a memory circuit including a plurality of mats and configured to output first read data having a data sequence identical to a data sequence of pattern data after the start of a read operation during a test operation mode operation and configured to output a fail address including error information of the first read data, and a data processing circuit configured to output the first read data as data and configured to generate fail location information by encoding the fail address.

22 Claims, 10 Drawing Sheets

FIG. 3

| CA<1> | CA<2> | CA<3> | CMD GEN |
|---|---|---|---|
| L | L | X | WT = H |
| L | H | X | RD = H |
| X | X | H | DBI = H |
| H | H | X | TM = H |

FIG. 4

| OPERATION | CA <4> | CA <5> | CA <6> | MAD <1> | MAD <2> | MAD <3> | MAD <4> | MAD <5> | MAD <6> | MAD <7> | MAD <8> |
|---|---|---|---|---|---|---|---|---|---|---|---|
| WRITE & READ | L | L | L | H | L | L | L | L | L | L | L |
| | L | L | H | L | H | L | L | L | L | L | L |
| | L | H | L | L | L | H | L | L | L | L | L |
| | L | H | H | L | L | L | H | L | L | L | L |
| | H | L | L | L | L | L | L | H | L | L | L |
| | H | L | H | L | L | L | L | L | H | L | L |
| | H | H | L | L | L | L | L | L | L | H | L |
| | H | H | H | L | L | L | L | L | L | L | H |
| DBI MODE | X | X | X | H | H | H | H | H | H | H | H |
| TEST MODE | X | X | X | H | H | H | H | H | H | H | H |

FIG. 8

| CASE | FAD<8> | FAD<7> | FAD<6> | FAD<5> | FAD<4> | FAD<3> | FAD<2> | FAD<1> | FAIF<4> | FAIF<3> | FAIF<2> | FAIF<1> |
|---|---|---|---|---|---|---|---|---|---|---|---|---|
| ERROR (1BIT) | L | L | L | L | L | L | L | H | L | L | L | H |
| | L | L | L | L | L | L | H | L | L | L | H | L |
| | L | L | L | L | L | H | L | L | L | L | H | H |
| | L | L | L | L | H | L | L | L | L | H | L | L |
| | L | L | L | H | L | L | L | L | L | H | L | H |
| | L | L | H | L | L | L | L | L | L | H | H | L |
| | L | H | L | L | L | L | L | L | L | H | H | H |
| | H | L | L | L | L | L | L | L | H | L | L | L |
| NO ERROR | L | L | L | L | L | L | L | L | H | H | H | H |
| ERROR (2BIT~) | L | L | H | L | L | H | L | L | L | L | L | L |
| | H | L | L | H | L | L | L | H | L | L | L | L |

SEMICONDUCTOR SYSTEM FOR DETECTING FAIL LOCATION

CROSS-REFERENCE TO RELATED APPLICATION

The present application claims priority under 35 U.S.C. § 119 (a) to Korean Patent Application No. 10-2023-0145904, filed in the Korean Intellectual Property Office on Oct. 27, 2023, which are incorporated herein by reference in their entirety.

BACKGROUND

The present disclosure relates to a semiconductor system for detecting a fail location by using a data processing circuit.

In an electronic device including a semiconductor device, the occurrence of a simultaneous switching noise (SSN) phenomenon and an inter symbol interface (ISI) phenomenon is increased as the number of bits having phases changed compared to previous timing, among the bits of data that are transmitted by a controller, is increased. Accordingly, when many bits, among the bits of data that are transmitted by the controller, having phases changed compared to previous timing are included in a semiconductor device, the semiconductor device reduces the occurrence of the SSN phenomenon and the ISI phenomenon by using a data bus inversion (DBI) operation including transmitting data by inverting the data.

Furthermore, in order to increase the operating speed of the semiconductor device, various methods of inputting/outputting data including multiple bits every clock cycle are used. When the input/output data speed increases, a separate device and method for guaranteeing the reliability of data transmission is additionally required because the probability that an error occurs during a process of the data being transmitted is also increased.

For example, a method of guaranteeing the reliability of data transmission by generating an error code capable of checking whether an error occurs whenever data are transmitted and transmitting the error code along with the data is used. The error code includes an error detection code (EDC) capable of detecting an error occurred and an error correction code (ECC) capable of autonomously correcting an error when the error occurs.

SUMMARY

In an embodiment, a semiconductor device may include a memory circuit including a plurality of mats and configured to output first read data having a data sequence identical to a data sequence of pattern data after the start of a read operation during a test operation mode operation and configured to output a fail address including error information of the first read data, and a data processing circuit configured to output the first read data as data and configured to generate fail location information by encoding the fail address.

In an embodiment, a semiconductor system may include a controller configured to output a command address during a data bus inversion operation, configured to receive data, configured to output the command address and pattern data during a test operation mode operation, and configured to receive fail location information, and a semiconductor device configured to output second read data as the data by inverting or not inverting the second read data based on a comparison between first read data and second read data after the start of read operations that are consecutively performed during a data bus inversion operation based on the command address, configured to output third read data as the data after the start of the read operation during the test operation mode operation based on the command address, and configured to output a fail address including error information of the third read data as fail location information by encoding the fail address when the third read data and the pattern data are different.

In an embodiment, a data output method may include detecting which of a data bus inversion operation and a test operation mode operation is to be performed based on a command address; performing a data bus inversion operation including: generating write data by receiving data after the start of a write operation based on the command address, storing the write data in a plurality of mats based on a plurality of mat addresses that are all enabled, and outputting, as the data, first read data and second read data that are output from the write data by one of inverting and not inverting the first read data and the second read data based on a comparison between the first read data and the second read data after the start of a read operation; and performing a test operation mode operation including: generating the write data by receiving the data identical with pattern data after the start of the write operation based on the command address, storing the write data in the plurality of mats, and outputting, as fail location information, third read data that are output from the write data and a fail address including error information of the third read data by encoding the third read data and the fail address after the start of the read operation.

A method comprising comparing first read data and pattern data resulting in comparison data; and when the first read data is different from the pattern data, performing a test operation mode operation including: outputting the first read data, outputting a fail address comprising error information of the first read data, and generating fail location information by encoding the fail address.

BRIEF DESCRIPTION OF THE DRAWINGS

FIG. 3 is a table indicating commands output by a command generation circuit that is included in the semiconductor device illustrated in FIG. 2.

FIG. 4 is a table indicating addresses output by an address generation circuit that is included in the semiconductor device illustrated in FIG. 2.

FIG. 8 is a table showing fail location information based on a fail address according to an embodiment of the present disclosure.

DETAILED DESCRIPTION

Figure 1:
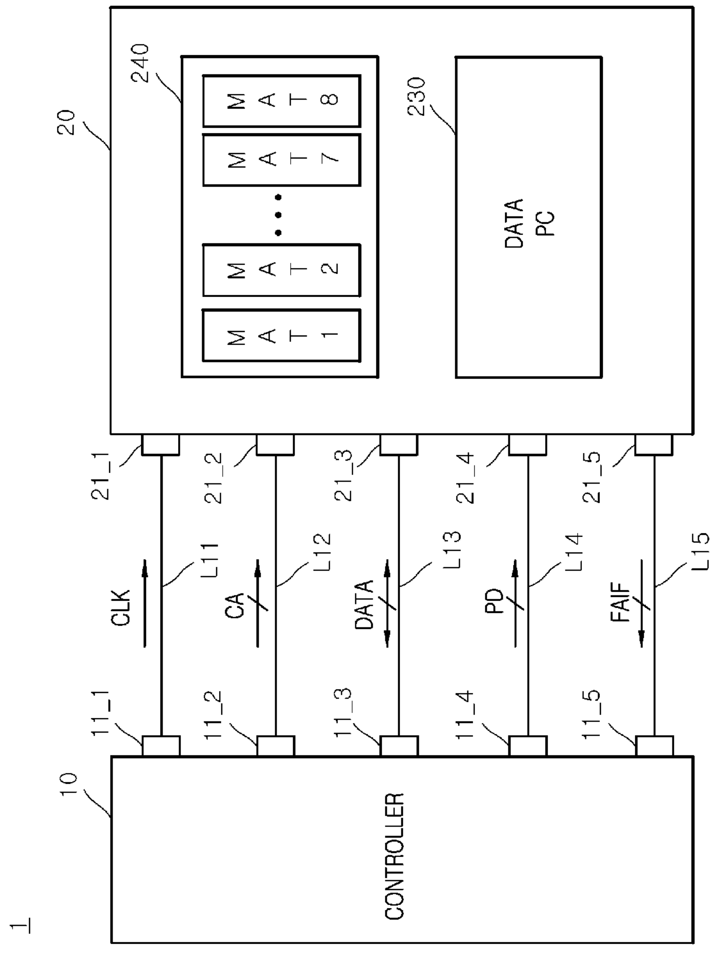
FIG. 1 is a block diagram illustrating a semiconductor system according to an embodiment of the present disclosure.

In the descriptions of the following embodiments, the term "preset" indicates that the numerical value of a parameter is previously decided, when the parameter is used during a process or algorithm. According to an embodiment, the numerical value of the parameter may be set when the process or algorithm is started or while the process or algorithm is performed.

Terms such as "first" and "second," which are used to distinguish among various components, the components are not limited by these terms. For example, a first component may be referred to as a second component, and vice versa. These terms are used to distinguish one element from other elements and do not imply size, order, priority, or importance.

When one component is referred to as being "coupled" or "connected" to another component, the components may be directly coupled or connected to each other or coupled or connected to each other through another component interposed therebetween. In contrast, when one component is referred to as being "directly coupled" or "directly connected" to another component, the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments. Logic levels may generally be referred to a bit values or data values.

The present disclosure will be described in more detail through embodiments. The embodiments are only used to provide examples within the present disclosure, and the scope of the present disclosure is not limited by the embodiments.

An embodiment of the present disclosure provides a semiconductor system for detecting a fail location by using a data processing circuit.

According to an embodiment of the present disclosure, fail location information is generated when pattern data and read data have different logic level comparisons after the start of a read operation, and a fail location is detected based on the fail location information by using the data processing circuit for performing a data bus inversion operation.

Furthermore, according to an embodiment of the present disclosure, data may be input and output by inverting the data when a comparison of data that are input and output during a previous operation and data that are currently input and output results in different data by a set quantity of data or more during a data bus inversion operation.

Furthermore, according to an embodiment of the present disclosure, current consumption may be reduced by inverting or not inverting data when performing a data bus inversion operation when data are input and output.

As illustrated in FIG. 1, a semiconductor system 1 according to an embodiment of the present disclosure may include a controller 10 and a semiconductor device 20.

The controller 10 includes a first control pin 11_1, a second control pin 11_2, a third control pin 11_3, a fourth control pin 11_4, and a fifth control pin 11_5. The semiconductor device 20 includes a first device pin 21_1, a second device pin 21_2, a third device pin 21_3, a fourth device pin 21_4, and a fifth device pin 21_5. A first transmission line L11 is connected between the first control pin 11_1 and the first device pin 21_1. A second transmission line L12 is connected between the second control pin 11_2 and the second device pin 21_2. A third transmission line L13 is connected between the third control pin 11_3 and the third device pin 21_3. A fourth transmission line L14 is connected between the fourth control pin 11_4 and the fourth device pin 21_4. A fifth transmission line L15 is connected between the fifth control pin 11_5 and the fifth device pin 21_5. The controller 10 transmits a clock CLK signal to the semiconductor device 20 through the first transmission line L11. The controller 10 transmits a command address CA to the semiconductor device 20 through the second transmission line L12. The controller 10 transmits data DATA to the semiconductor device 20 through the third transmission line L13 and receives data DATA from the semiconductor device 20 through the third transmission line L13. The controller 10 transmits pattern data PD to the semiconductor device 20 through the fourth transmission line L14. The controller 10 receives fail location information FAIF from the semiconductor device 20 through the fifth transmission line L15. The clock CLK signal is a signal that is periodically toggled or varied in amplitude in order to synchronize operations between the controller 10 and the semiconductor device 20. The command address CA may include a first group and a second group each including multiple bits. The first group of the command address CA may include bits that generate a command for controlling an operation of the semiconductor device 20. The second group of the command address CA may include bits that generate a mat address for selecting a plurality of mats that are included in the semiconductor device 20. The data DATA may include multiple bits and may be data that are input and output after the start of a write operation and a read operation in the controller 10 and the semiconductor device 20. The pattern data PD may include multiple bits and may include data having a preset logic level combination, such as preset sequence of bit values, during a test operation mode operation. The fail location information FAIF may include multiple bits and may be a signal for detecting fail locations for a plurality of mats (241, 242, 243, 244, 245,246, 247, 248 in FIG. 7) that are included in the semiconductor device 20 during the test operation mode operation.

The controller 10 outputs to the semiconductor device 20 the clock CLK signal, the command address CA, the data DATA, and the pattern data PD for controlling a normal operation, a data bus inversion operation, and a test operation mode operation. The controller 10 may output, to the semiconductor device 20, the data DATA having the same logic level combination, or data sequence, as the pattern data PD during the test operation mode operation. The controller 10 may detect a fail location in the plurality of mats (241 through 248 in FIG. 7) by receiving the fail location information FAIF from the semiconductor device 20 during the test operation mode operation.

The semiconductor device 20 may include a data processing circuit (DATA PC) 230 and a memory circuit 240.

The data processing circuit 230 may output second read data (RID<1:64> in FIG. 2) as the data DATA by inverting or not inverting the second read data (RID<1:64> in FIG. 2) based on a comparison between first read data (RID<1:64> in FIG. 2) and the second read data (RID<1:64> in FIG. 2) and based on the command address CA after the start of read operations that are consecutively performed during a data bus inversion operation. The data processing circuit 230 may output third read data (RID<1:64> in FIG. 2) as the data DATA after the start of a read operation during a test operation mode operation based on the command address CA. The data processing circuit 230 may output, as the fail location information FAIF, a fail address (FAD<1:8> in FIG. 2) including error information related to the third read data (RID<1:64> in FIG. 2) by encoding the fail address (FAD<1:8> in FIG. 2) after the start of a read operation during a test operation mode operation based on the command address CA. The first read data (RID<1:64> in FIG. 2) indicates that the read data (RID<1:64> in FIG. 2) are output after the start of a read operation that is first performed during a data bus inversion operation. The second read data (RID<1:64> in FIG. 2) indicates that the read data (RID<1:64> in FIG. 2) are output after the start of a read operation that is performed after the first read data (RID<1:64> in FIG. 2) are output during the data bus inversion operation. The third read data (RID<1:64> in FIG. 2) indicates that the read data (RID<1:64> in FIG. 2) are output after the start of a read operation during a test operation mode operation.

The memory circuit 240 includes the plurality of mats MAT1 241, MAT2 242, . . . . MAT7 247, MAT8 248 in FIG. 2. The memory circuit 240 may output the first read data (RID<1:64> in FIG. 2) and the second read data (RID<1:64> in FIG. 2) when all of the plurality of mats (MAT1 241, MAT2 242, . . . . MAT7 247, MAT8 248 in FIG. 2) are selected after the start of read operations that are consecutively performed during a data bus inversion operation. The memory circuit 240 may output the third read data (RID<1:64> in FIG. 2) when all of the plurality of mats (MAT1 241, MAT2 242, . . . . MAT7 247, MAT8 248 in FIG. 2) are selected after the start of a read operation during a test operation mode operation. The memory circuit 240 may output the fail address (FAD<1:8> in FIG. 2) including error information of the third read data (RID<1:64> in FIG. 2) after the start of a read operation during a test operation mode operation.

The semiconductor device 20 may output the second read data (RID<1:64> in FIG. 2) as the data DATA by inverting or not inverting the second read data (RID<1:64> in FIG. 2) based on a comparison between the first read data (RID<1:64> in FIG. 2) and the second read data (RID<1:64> in FIG. 2) and based on the command address CA after the start of read operations that are consecutively performed during a data bus inversion operation. The semiconductor device 20 may output the third read data (RID<1:64> in FIG. 2) as the data DATA after the start of a read operation during a test operation mode operation based on the command address CA. The semiconductor device 20 may output, as the fail location information FAIF, the fail address (FAD<1:8> in FIG. 2) including error information of the third read data (RID<1:64> in FIG. 2) by encoding the fail address (FAD<1:8> in FIG. 2) after the start of a read operation during a test operation mode operation based on the command address CA.

Figure 2:
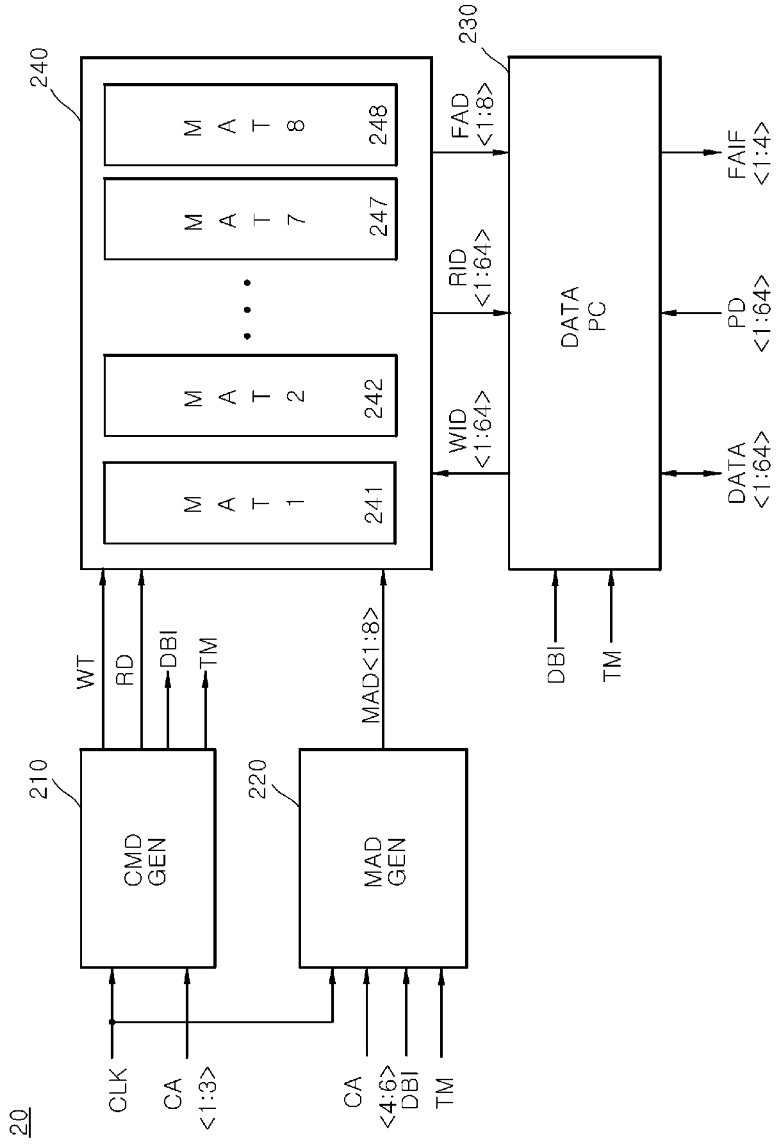
FIG. 2 is a block diagram illustrating an example of a semiconductor device that may be included in the semiconductor system illustrated in FIG. 1.

FIG. 2 is a block diagram illustrating an embodiment of the semiconductor device 20. As illustrated in FIG. 2, the semiconductor device 20 includes a command generation circuit (CMD GEN) 210, an address generation circuit (MAD GEN) 220, the data processing circuit 230, and the memory circuit 240.

The command generation circuit 210 may generate a write command WT, a read command RD, a data bus inversion command DBI, and a test mode command TM, based on the first group CA<1:3> of the command address in synchronization with the clock CLK signal. The command generation circuit 210 may generate the write command WT, the read command RD, the data bus inversion command DBI, and the test mode command TM that are selectively enabled by decoding the first group CA<1:3> of the command address in synchronization with the clock CLK signal. An operation of generating, by the command generation circuit 210, the write command WT, the read command RD, the data bus inversion command DBI, and the test mode command TM that are selectively enabled by decoding the first group CA<1:3> of the command address will be described in detail with reference to FIG. 3.

The address generation circuit 220 may generate first through eighth mat addresses MAD<1:8> based on the second group CA<4:6> of the command address in synchronization with the clock CLK signal. The address generation circuit 220 may generate the first through eighth mat addresses MAD<1:8> that are selectively enabled by decoding the second group CA<4:6> of the command address in synchronization with the clock CLK signal after the start of a write operation and read operation of a normal operation. The address generation circuit 220 may generate the first through eighth mat addresses MAD<1:8> that are selectively enabled by decoding the second group CA<4:6> of the command address in synchronization with the clock CLK signal when the data bus inversion command DBI and the test mode command TM are disabled.

The address generation circuit 220 may generate the first through eighth mat addresses MAD<1:8> that are all enabled during a data bus inversion operation and a test operation mode operation. The address generation circuit 220 may generate the first through eighth mat addresses MAD<1:8> that are all enabled when the data bus inversion command DBI and the test mode command TM are enabled.

The data processing circuit 230 may generate write data WID<1:64> from data DATA<1:64> after the start of a write operation of a normal operation. The data processing circuit 230 may generate a plurality of bits of the write data WID<1:64> from a plurality of bits of the data DATA<1:64> after the start of a common write operation.

The data processing circuit 230 may generate the data DATA<1:64> from the read data RID<1:64> after the start of a read operation of a normal operation. The data processing circuit 230 may generate a plurality of bits of the data DATA<1:64> from a plurality of bits of the read data RID<1:64> after the start of a read operation of a normal operation.

The data processing circuit 230 may output the second data DATA<1:64> as the write data WID<1:64> by inverting or not inverting the second data DATA<1:64> based on a comparison between the first data DATA<1:64> and the second data DATA<1:64> after the start of write operations that are consecutively performed during a data bus inversion operation. When the data bus inversion command DBI is enabled, the data processing circuit 230 may output the second data DATA<1:64> as the write data WID<1:64> by inverting or not inverting the second data DATA<1:64> based on a comparison between the first data DATA<1:64> and the second data DATA<1:64> that are consecutively input. The first data DATA<1:64> indicates that the data DATA<1:64> are input after the start of a write operation that is first performed during a data bus inversion operation. The second data DATA<1:64> indicates that the data DATA<1:64> are input after the start of a write operation after the first data DATA<1:64> are input during a data bus inversion operation.

The data processing circuit 230 may output the second read data RID<1:64> as the data DATA<1:64> by inverting or not inverting the second read data RID<1:64> based on a comparison between the first read data RID<1:64> and the second read data RID<1:64> after the start of read operations that are consecutively performed during a data bus inversion operation. When the data bus inversion command DBI is enabled, the data processing circuit 230 may output the second read data RID<1:64> as the data DATA<1:64> by inverting or not inverting the second read data RID<1:64> based on a comparison between the first read data RID<1:64> and the second read data RID<1:64> that are consecutively input. The first read data RID<1:64> indicates that the read data RID<1:64> are input after the start of a read operation that is first performed during a data bus inversion operation. The second read data RID<1:64> indicates that the read data RID<1:64> are input after the start of a read operation that is performed after the read data RID<1:64> are input during the data bus inversion operation.

The data processing circuit 230 outputs, as third write data WID<1:64>, the data DATA<1:64> having the same logic level combination, i.e., the same data sequence, as the pattern data PD<1:64> after the start of a write operation during a test operation mode operation. When the test mode command TM is enabled, the data processing circuit 230 outputs, as the third write data WID<1:64>, the data DATA<1:64> having the same logic level combination, or data sequence, as the pattern data PD<1:64>. The third write data WID<1:64> may indicate that the write data WID<1:64> are output after the start of a write operation during a test operation mode operation.

The data processing circuit 230 may output the third read data RID<1:64> as the data DATA<1:64> after the start of a read operation during a test operation mode operation. The data processing circuit 230 may output the third read data RID<1:64> as the data DATA<1:64> by inverting or not inverting the third read data RID<1:64> based on a comparison between the pattern data PD<1:64> and the third read data RID<1:64> when the test mode command TM is enabled. The data processing circuit 230 may output, as first through fourth pieces of fail location information FAIF<1:4>, the fail address FAD<1:8> including error information of the third read data RID<1:64> by encoding the fail address FAD<1:8> after the start of a read operation during a test operation mode operation. The third read data RID<1:64> indicates that the read data RID<1:64> are output after the start of a read operation during a test operation mode operation.

The memory circuit 240 includes the first mat MAT1 241 through the eighth mats MAT8 248.

The memory circuit 240 may store a plurality of bits of the write data WID<1:64> in a mat that is selected among the first mat MAT1 241 through the eighth mat MAT8 248, after the start of a write operation of a normal operation. The memory circuit 240 may store the plurality of bits of the write data WID<1:64> in a mat that is selected among the first mat MAT1 241 through the eighth mat MAT8 248, based on the first through eighth mat addresses MAD<1:8> when the write command WT is enabled during a normal operation.

The memory circuit 240 may output the plurality of bits of the write data WID<1:64>, which are stored in a mat that is selected among the first mat MAT1 241 through the eighth mat MAT8 248, as a plurality of bits of the read data RID<1:64> after the start of a read operation of a normal operation. The memory circuit 240 may output the plurality of bits of the write data WID<1:64>, which are stored in a mat that is selected among the first mat MAT1 241 through the eighth mat MAT8 248, as the plurality of bits of the read data RID<1:64> based on the first through eighth mat addresses MAD<1:8> when the read command RD is enabled during a normal operation.

The memory circuit 240 stores the write data WID<1:64> when all of the first mat MAT1 241 through the eighth mat MAT8 248 are selected after the start of a write operation during a data bus inversion operation. The memory circuit 240 may store first write data WID<1:64> and second write data WID<1:64> in the first mat MAT1 241 through the eighth mats MAT8 248 after the start of write operations that are consecutively performed during a data bus inversion operation. The memory circuit 240 may store the first write data WID<1:64> in the first mat MAT1 241 through the eighth mat MAT8 248 based on the first through eighth mat addresses MAD<1:8> that are all enabled when the write command WT is enabled after the start of a first write operation during a data bus inversion operation. The memory circuit 240 stores the second write data WID<1:64> in the first mat MAT1 241 through the eighth mat MAT8 248 based on the first through eighth mat addresses MAD<1:8> that are all enabled when the write command WT is enabled after the start of a second write operation during the data bus inversion operation. The first write operation and the second write operation indicate write operations that are consecutively performed. The second write operation indicates a write operation that is performed after the first write operation is performed. The first write data WID<1:64> indicates that the write data WID<1:64> are input after the start of the first write operation that is first performed during the data bus inversion operation. The second write data WID<1:64> indicates that the write data WID<1:64> are input after the start of the second write operation that is performed after the first write data WID<1:64> are input during the data bus inversion operation.

The memory circuit 240 may output the read data RID<1:64> when all of the first mat MAT1 241 through the eighth mat MAT8 248 are selected after the start of a read operation during a data bus inversion operation. The memory circuit 240 may output, as the first read data RID<1:64> and the second read data RID<1:64>, the first write data WID<1:64> and the second write data WID<1:64> that are stored in the first mat MAT1 241 through the eighth mat MAT8 248, after the start of read operations that are consecutively performed during a data bus inversion operation. The memory circuit 240 may output, as the first read data RID<1:64>, the first write data WID<1:64> that are stored in the first mat MAT1 241 through the eighth mat MAT8 248 based on the first through eighth mat addresses MAD<1:8> that are all enabled when the read command RD is enabled after the start of a first read operation during a data bus inversion operation. The memory circuit 240 may output, as the second read data RID<1:64>, the second write data WID<1:64> that are stored in the first mat MAT1 241 through the eighth mat MAT8 248 based on the first through eighth mat addresses MAD<1:8> that are all enabled when the read command RD is enabled after the start of a second read operation during the data bus inversion operation. The first read operation and the second read operation indicate read operations that are consecutively performed. The second read operation indicates a read operation that is performed after the first read operation was performed. The first read data RID<1:64> indicates that the read data RID<1:64> are output after the start of the first read operation that is first performed during the data bus inversion operation. The second read data RID<1:64> indicates that the read data RID<1:64> are output after the start of the second read operation that is performed after the first read data RID<1:64> are output during the data bus inversion operation.

The memory circuit 240 may store the third write data WID<1:64> when all of the first mat MAT1 241 through the eighth mat MAT8 248 are selected after the start of a write operation during a test operation mode operation. The memory circuit 240 may store the third write data WID<1:64> having the same logic level combination, or data sequence, as the pattern data PD<1:64> in the first mat MAT1 241 through the eighth mat MAT8 248 based on the first through eighth mat addresses MAD<1:8> that are all enabled when the write command WT is enabled during a test operation mode operation. The third write data WID<1:64> indicates that the write data WID<1:64> are input after the start of a write operation during the test operation mode operation.

The memory circuit 240 outputs, as the third read data RID<1:64>, the third write data WID<1:64> that are stored in the first mat MAT1 241 through the eighth matMAT8 248 when all of the first mat MAT1 241 through the eighth mat MAT8 248 are selected after the start of a read operation during a test operation mode operation. The memory circuit 240 outputs, as the third read data RID<1:64>, the third write data WID<1:64> that are stored in the first mat MAT1 241 through the eighth mat MAT8 248 based on the first through eighth mat addresses MAD<1:8> that are all enabled when the read command RD is enabled during a test operation mode operation. The memory circuit 240 may output the first through eighth fail addresses FAD<1:8> including error information of the third read data (RID<1:64> in FIG. 2) after the start of a read operation during a test operation mode operation. The third read data RID<1:64> indicates that the read data RID<1:64> are output after the start of a read operation during a test operation mode operation.

The semiconductor device 20 may generate the plurality of bits of the write data WID<1:64> from the plurality of bits of the data DATA<1:64> after the start of a write operation of a normal operation based on the command address CA. The semiconductor device 20 may store the plurality of bits of the write data WID<1:64> in a mat that is selected among the first mat MAT1 241 through the eighth mat MAT 8 248, after the start of a write operation of a normal operation based on the command address CA. The semiconductor device 20 may generate the plurality of bits of the data DATA<1:64> from the plurality of bits of the read data RID<1:64> after the start of a read operation of a normal operation based on the command address CA. The semiconductor device 20 may output, as the plurality of bits of the data DATA<1:64>, the plurality of bits of the read data RID<1:64> that are output by a mat that is selected among the first mat MAT1 241 through the eighth mat MAT8 248, after the start of a read operation of a normal operation based on the command address CA. The semiconductor device 20 may generate the write data WID<1:64> by inverting or not inverting the second data DATA<1:64> based on a comparison between the first data DATA<1:64> and the second data DATA<1:64> after the start of write operations that are consecutively performed during a data bus inversion operation based on the command address CA. The semiconductor device 20 may store the first write data WID<1:64> and the second write data WID<1:64> in the first mat MAT1 241 through the eighth mat MAT 8 248 after the start of write operations that are consecutively performed during a data bus inversion operation based on the command address CA. The semiconductor device 20 outputs the second read data RID<1:64> as the data DATA<1:64> by inverting or not inverting the second read data RID<1:64> based on a comparison between the first read data RID<1:64> and the second read data RID<1:64> that are output by the first mat MAT1 241 through the eighth mat MAT8 248 after the start of read operations that are consecutively performed during a data bus inversion operation based on the command address CA. The semiconductor device 20 outputs the third read data RID<1:64> as the data DATA<1:64> after the start of a read operation during a test operation mode operation based on the command address CA. The semiconductor device 20 may output the first through eighth fail addresses FAD<1:8> including error information of the third read data RID<1:64> as the first through fourth pieces of fail location information FAIF<1:4> by encoding the first through eighth fail addresses FAD<1:8> after the start of a read operation during a test operation mode operation based on the command address CA.

FIG. 3 is a table indicating commands output by the command generation circuit 210 that is included in the semiconductor device 20 according to an embodiment of the present disclosure.

The command generation circuit 210 generates the write command WT as enabled at a logic high level H when a first bit CA<1> of the first group of the command address has a logic low level L and a second bit CA<2> of the first group of the command address has a logic low level L in synchronization with the clock CLK signal after the start of a write operation of a normal operation.

The command generation circuit 210 generates the read command RD as enabled at a logic high level H when the first bit CA<1> of the first group of the command address has a logic low level L and the second bit CA<2> of the first group of the command address has a logic high level H in synchronization with the clock CLK signal after the start of a read operation of a normal operation.

The command generation circuit 210 generates the data bus inversion command DBI as enabled at a logic high level H when a third bit CA<3> of the first group of the command address has a logic high level H to start or initiate a data bus inversion operation.

The command generation circuit 210 generates the write command WT as enabled at a logic high level H when the first bit CA<1> of the first group of the command address has a logic low level L and the second bit CA<2> of the first group of the command address has a logic low level L in synchronization with the clock CLK signal after the data bus inversion command DBI is enabled at a logic high level H after the start of a write operation during a data bus inversion operation.

The command generation circuit 210 generates the read command RD as enabled at a logic high level H when the first bit CA<1> of the first group of the command address has a logic low level L and the second bit CA<2> of the first group of the command address has a logic high level H in synchronization with the clock CLK signal after the start of a read operation, after the data bus inversion command DBI is enabled at a logic high level H after the start of a read operation during a data bus inversion operation.

The command generation circuit 210 generates the test mode command TM as enabled at a logic high level H when the first bit CA<1> of the first group of the command address has a logic high level H and the second bit CA<2> of the first group of the command address has a logic high level H to start or initiate a test operation mode operation.

The command generation circuit 210 generates the write command WT as enabled at a logic high level H when the first bit CA<1> of the first group of the command address has a logic low level L and the second bit CA<2> of the first group of the command address has a logic low level L in synchronization with the clock CLK signal, after the test mode command TM is enabled at a logic high level H after the start of a write operation during a test operation mode operation.

The command generation circuit 210 generate the read command RD as enabled at a logic high level H when the first bit CA<1> of the first group of the command address has a logic low level L and the second bit CA<2> of the first group of the command address has a logic high level H in synchronization with the clock CLK signal after the start of a read operation, after the test mode command TM is enabled at a logic high level H after the start of a read operation during a test operation mode operation.

FIG. 4 is a table indicating addresses output by the address generation circuit 220 that is included in the semiconductor device 20 according to an embodiment of the present disclosure.

The address generation circuit 220 generates the first mat address MAD<1> as enabled at a logic high level H when a fourth bit CA<4> of the second group of the command address has a logic low level L, a fifth bit CA<5> of the second group of the command address has a logic low level L, and a sixth bit CA<6> of the second group of the command address has a logic low level L in synchronization with the clock CLK signal, when the data bus inversion command DBI and the test mode command TM are disabled at a logic low level L after the start of a write operation and read operation of a normal operation.

The address generation circuit 220 generates the second mat address MAD<2> as enabled at a logic high level H when the fourth bit CA<4> of the second group of the command address has a logic low level L, the fifth bit CA<5> of the second group of the command address has a logic low level L, and the sixth bit CA<6> of the second group of the command address has a logic high level H in synchronization with the clock CLK signal, when the data bus inversion command DBI and the test mode command TM are disabled at a logic low level L after the start of a write operation and read operation of a normal operation.

The address generation circuit 220 generates the third mat address MAD<3> as enabled at a logic high level H when the fourth bit CA<4> of the second group of the command address has a logic low level L, the fifth bit CA<5> of the second group of the command address has a logic high level H, and the sixth bit CA<6> of the second group of the command address has a logic low level L in synchronization with the clock CLK signal, when the data bus inversion command DBI and the test mode command TM are disabled at a logic low level L after the start of a write operation and read operation of a normal operation.

The address generation circuit 220 generates the fourth mat address MAD<4> as enabled at a logic high level H when the fourth bit CA<4> of the second group of the command address has a logic low level L, the fifth bit CA<5> of the second group of the command address has a logic high level H, and the sixth bit CA<6> of the second group of the command address has a logic high level H in synchronization with the clock CLK signal, when the data bus inversion command DBI and the test mode command TM are disabled at a logic low level L after the start of a write operation and read operation of a normal operation.

The address generation circuit 220 generates the fifth mat address MAD<5> as enabled at a logic high level H when the fourth bit CA<4> of the second group of the command address has a logic high level H, the fifth bit CA<5> of the second group of the command address has a logic low level L, and the sixth bit CA<6> of the second group of the command address has a logic low level L in synchronization with the clock CLK signal, when the data bus inversion command DBI and the test mode command TM are disabled at a logic low level L after the start of a write operation and read operation of a normal operation.

The address generation circuit 220 generates the sixth mat address MAD<6> as enabled at a logic high level H when the fourth bit CA<4> of the second group of the command address has a logic high level H, the fifth bit CA<5> of the second group of the command address has a logic low level L, and the sixth bit CA<6> of the second group of the command address has a logic high level H in synchronization with the clock CLK signal, when the data bus inversion command DBI and the test mode command TM are disabled at a logic low level L after the start of a write operation and read operation of a normal operation.

The address generation circuit 220 generates the seventh mat address MAD<7> as enabled at a logic high level H when the fourth bit CA<4> of the second group of the command address has a logic high level H, the fifth bit CA<5> of the second group of the command address has a logic high level H, and the sixth bit CA<6> of the second group of the command address has a logic low level L in synchronization with the clock CLK signal, when the data bus inversion command DBI and the test mode command TM are disabled at a logic low level L after the start of a write operation and read operation of a normal operation.

The address generation circuit 220 generates the eighth mat address MAD<8> as enabled at a logic high level H when the fourth bit CA<4> of the second group of the command address has a logic high level H, the fifth bit CA<5> of the second group of the command address has a logic high level H, and the sixth bit CA<6> of the second group of the command address has a logic high level H in synchronization with the clock CLK signal, when the data bus inversion command DBI and the test mode command TM are disabled at a logic low level L after the start of a write operation and read operation of a normal operation.

The address generation circuit 220 generates the first through eighth mat addresses MAD<1:8> that are all enabled at a logic high level H when the data bus inversion command DBI is enabled at a logic high level H after the start of a data bus inversion operation.

The address generation circuit 220 generates the first through eighth mat addresses MAD<1:8> that are all enabled at a logic high level H when the test mode command TM is enabled at a logic high level H after the start of a test operation mode operation.

Figure 5:
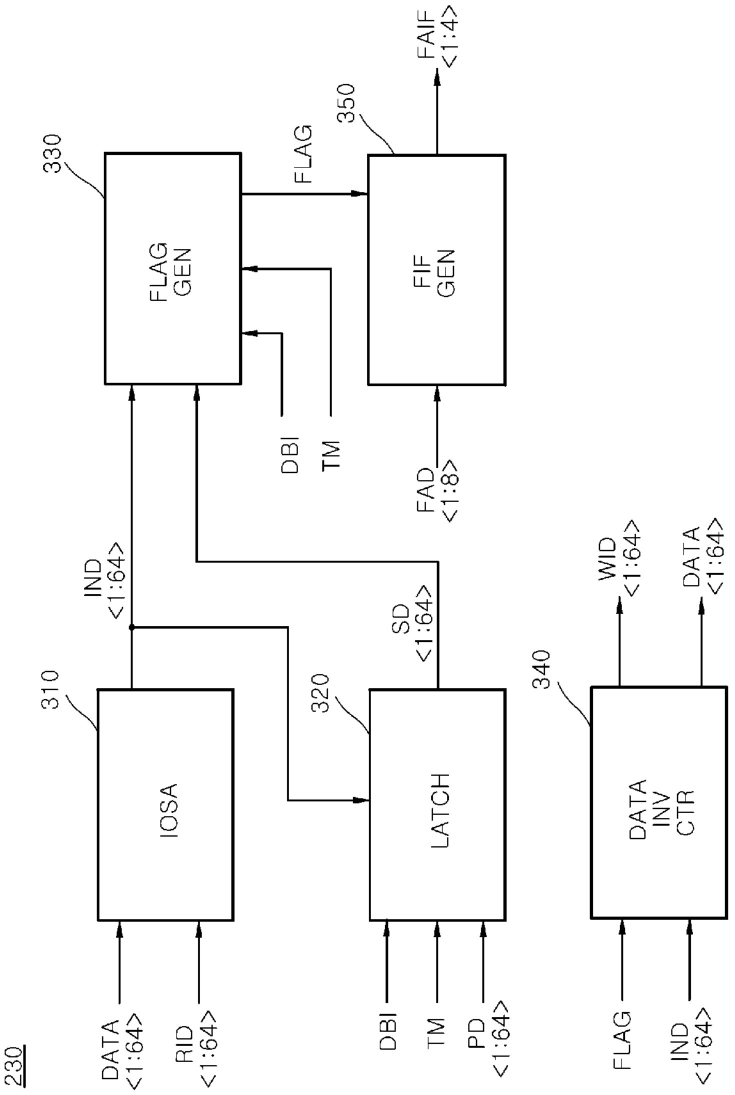
FIG. 5 is a block diagram illustrating an example of a data processing circuit of the semiconductor device illustrated in FIG. 2.

FIG. 5 is a block diagram illustrating an example of the data processing circuit 230 of the semiconductor device 20 illustrated in FIG. 2. As illustrated in FIG. 5, the data processing circuit 230 includes an input and output sense amplifier (IOSA) 310, a latch circuit (LATCH) 320, a flag signal generation circuit (FLAG GEN) 330, a data inversion control circuit (DATA INV CTR) 340, and a fail location information generation circuit (FIF GEN) 350.

The input and output sense amplifier 310 generates input data IND<1:64> based on the data DATA<1:64> after the start of a write operation during a normal operation, a data bus inversion operation, and a test operation mode operation. The input and output sense amplifier 310 generates the input data IND<1:64> by detecting and amplifying the data DATA<1:64> after the start of a write operation during a normal operation, a data bus inversion operation, and a test operation mode operation. The input and output sense amplifier 310 generates the input data IND<1:64> based on the read data RID<1:64> after the start of a read operation during a normal operation, a data bus inversion operation, and a test operation mode operation. The input and output sense amplifier 310 generates the input data IND<1:64> by detecting and amplifying the read data RID<1:64> after the start of a write operation during a normal operation, a data bus inversion operation, and a test operation mode operation.

The latch circuit 320 generates storage data SD<1:64> by storing the input data IND<1:64> that are generated from the data DATA<1:64> when the data bus inversion command DBI is enabled after the start of a write operation during a data bus inversion operation. The latch circuit 320 generates the storage data SD<1:64> by storing the input data IND<1:64> that are generated from the read data RID<1:64> when the data bus inversion command DBI is enabled after the start of a read operation during a data bus inversion operation. The latch circuit 320 generates the storage data SD<1:64> by storing the pattern data PD<1:64> when the test mode command TM is enabled after the start of a write operation and a read operation during a test operation mode operation.

The flag signal generation circuit 330 generates a flag signal FLAG by comparing the input data IND<1:64> and the storage data SD<1:64> based on the data bus inversion command DBI and the test mode command TM. In one embodiment, a bit-by-bit comparison of the logic levels of the bits in the input data IND<1:64> and the logic levels of the bits in the storage data SD<1:64> results in bits of comparison data CD<1:64>, where the nth bit of comparison data CD<1:n> is either at a logic low level or a logic high level depending on whether IND<1:n> and SD<1:n> are the same or different, respectively. For example, when differing bits in the comparison data CD<1:64> are set as a logic level high, counting the quantity of logic level high values among the bits in the comparison data CD<1:64> results in an integer from 0 to 64 that represents the quantity of differing bits. See FIG. 6 and the associated text for additional details. When the data bus inversion command DBI is enabled, the flag signal generation circuit 330 generates the flag signal FLAG as enabled when a bit-by-bit comparison of the logic levels of the bits in the input data IND<1:64> and the logic levels of the bits in the storage data SD<1:64> results in a quantity of differing bits or differing logic levels by a preset quantity or more, for example, when the quantity of logic level high values among the bits in the comparison data CD<1:64> results in an integer that is equal to the preset quantity or higher. The preset quantity may be set to 33. In the example where the preset quantity is 33, when the data bus inversion command DBI is enabled, the flag signal generation circuit 330 generates the flag signal FLAG as enabled when the quantity of differing bits or differing logic levels resulting from a bit-by-bit comparison of the input data IND<1:64> and the storage data SD<1:64> is 33 or more, the preset quantity. When the test mode command TM is enabled, the flag signal generation circuit 330 generates the flag signal FLAG as enabled when the input data IND<1:64> and the storage data SD<1:64> have at least one bit of different data or one different logic level when the input data IND<1:64> and the storage data SD<1:64> are compared. For example, while the test mode command TM is enabled, when the comparison data CD<1:64> has at least one bit indicating different data, the flag signal generation circuit 330 generates the flag signal FLAG as enabled. The flag signal generation circuit 330 generates the flag signal FLAG as enabled when the quantity of different bits or logic levels between the input data IND<1:64> and the storage data SD<1:64> is at least one when the test mode command TM is enabled.

The data inversion control circuit 340 generates the write data WID<1:64> by not inverting the input data IND<1:64> that are generated from the data DATA<1:64> after the start of a write operation of a normal operation. Not inverting data includes, for example, leaving the data as is or not modifying the data. The data inversion control circuit 340 generates the write data WID<1:64> by inverting the input data IND<1:64> that are generated from the data DATA<1:64>, when the flag signal FLAG is enabled after the start of a write operation during a data bus inversion operation. The data inversion control circuit 340 generates the write data WID<1:64> by inverting the input data IND<1:64> that are generated from the data DATA<1:64> when the flag signal FLAG is disabled after the start of a write operation during a data bus inversion operation. The data inversion control circuit 340 generates the write data WID<1:64> by not inverting the input data IND<1:64> that are generated from the data DATA<1:64> after the start of a write operation during a test operation mode operation.

The data inversion control circuit 340 generates the data DATA<1:64> by not inverting the input data IND<1:64> that are generated from the read data RID<1:64> after the start of a read operation of a normal operation. The data inversion control circuit 340 generates the data DATA<1:64> by inverting the input data IND<1:64> that are generated from the read data RID<1:64> when the flag signal FLAG is enabled after the start of a read operation during a data bus inversion operation. The data inversion control circuit 340 generates the data DATA<1:64> by inverting the input data IND<1:64> that are generated from the read data RID<1:64> when the flag signal FLAG is disabled after the start of a read operation during a data bus inversion operation. The data inversion control circuit 340 generates the data DATA<1:64> by not inverting the input data IND<1:64> that are generated from the read data RID<1:64> after the start of a read operation during a test operation mode operation.

The fail location information generation circuit 350 generates the first through fourth pieces of fail location information FAIF<1:4> by encoding the first through eighth fail addresses FAD<1:8> when the flag signal FLAG is enabled after the start of a read operation during a test operation mode operation. An operation of generating, by the fail location information generation circuit 350, the first through fourth pieces of fail location information FAIF<1:4> by encoding the first through eighth fail addresses FAD<1:8> when the flag signal FLAG is enabled will be described in detail with reference to FIG. 8.

Figure 6:
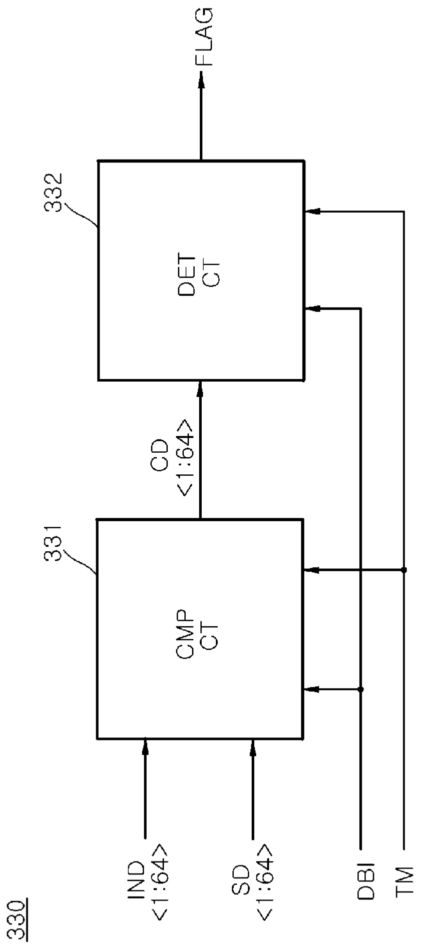
FIG. 6 is a block diagram illustrating an example of a flag signal generation circuit of the data processing circuit illustrated in FIG. 5.

FIG. 6 is a block diagram illustrating an example of the flag signal generation circuit 330 of the data processing circuit 230 illustrated in FIG. 5. As illustrated in FIG. 6, the flag signal generation circuit 330 includes a comparison circuit (CMP CT) 331 and a detection circuit (DET CT) 332.

The comparison circuit 331 generates comparison data CD<1:64> by comparing the input data IND<1:64> and storage data SD<1:64>. The comparison circuit 331 generates the comparison data CD<1:64> by comparing the input data IND<1:64> and the storage data SD<1:64> when the data bus inversion command DBI is enabled. For example, when a first bit IND<1> of the input data and a first bit SD<1> of the storage data have different logic levels when the data bus inversion command DBI is enabled, the comparison circuit 331 generates a first bit CD<1> of the comparison data having a logic high level. When the first bit IND<1> of the input data and the first bit SD<1> of the storage data have the same logic level when the data bus inversion command DBI is enabled, the comparison circuit 331 generates the first bit CD<1> of the comparison data having a logic low level. When the data bus inversion command DBI is enabled, the remaining bits IND<2> through IND<64> of the input data and SD<2> through SD<64> are compared in a similar way to generate CD<2> through CD<64>, respectively. The comparison circuit 331 generates the comparison data CD<1:64> by comparing the input data IND<1:64> and the storage data SD<1:64> when the test mode command TM is enabled. For example, when the first bit IND<1> of the input data and the first bit SD<1> of the storage data have different logic levels when the test mode command TM is enabled, the comparison circuit 331 generates the first bit CD<1> of the comparison data having a logic high level. When the first bit IND<1> of the input data and the first bit SD<1> of the storage data have the same logic level when the test mode command TM is enabled, the comparison circuit 331 generates the first bit CD<1> of the comparison data having a logic low level. When the test mode command TM is enabled, the remaining bits IND<2> through IND<64> of the input data and SD<2> through SD<64> are compared in a similar way to generate CD<2> through CD<64>, respectively. In an alternative example, a logic low level may represent differing bits and a logic high level may represent similar bits in the comparison data CD<1:64>.

The detection circuit 332 generates the flag signal FLAG by determining logic levels of the comparison data CD<1:64> based on the data bus inversion command DBI and the test mode command TM. The detection circuit 332 generates the flag signal FLAG as enabled when the quantity of differing bits or logic levels that are included in the comparison data CD<1:64> is a preset quantity or more when the data bus inversion command DBI is enabled. For example, the detection circuit 332 generates the flag signal FLAG as enabled when the quantity of logic high levels included in the bits of the comparison data CD<1:64> is 33 or more when the data bus inversion command DBI is enabled. The detection circuit 332 generates the flag signal FLAG as disabled when the quantity of logic high levels included in the bits of the comparison data CD<1:64> is less than 33 when the data bus inversion command DBI is enabled.

The detection circuit 332 generates the flag signal FLAG as enabled when the quantity of logic high levels included in the bits of the comparison data CD<1:64> is at least one when the test mode command TM is enabled. The detection circuit 332 generates the flag signal FLAG as disabled when a logic high level is not included in any of the bits of the comparison data CD<1:64> when the test mode command TM is enabled, which occurs when the input data IND<1:64> data and the storage data SD<1:64> are identical.

Figure 7:
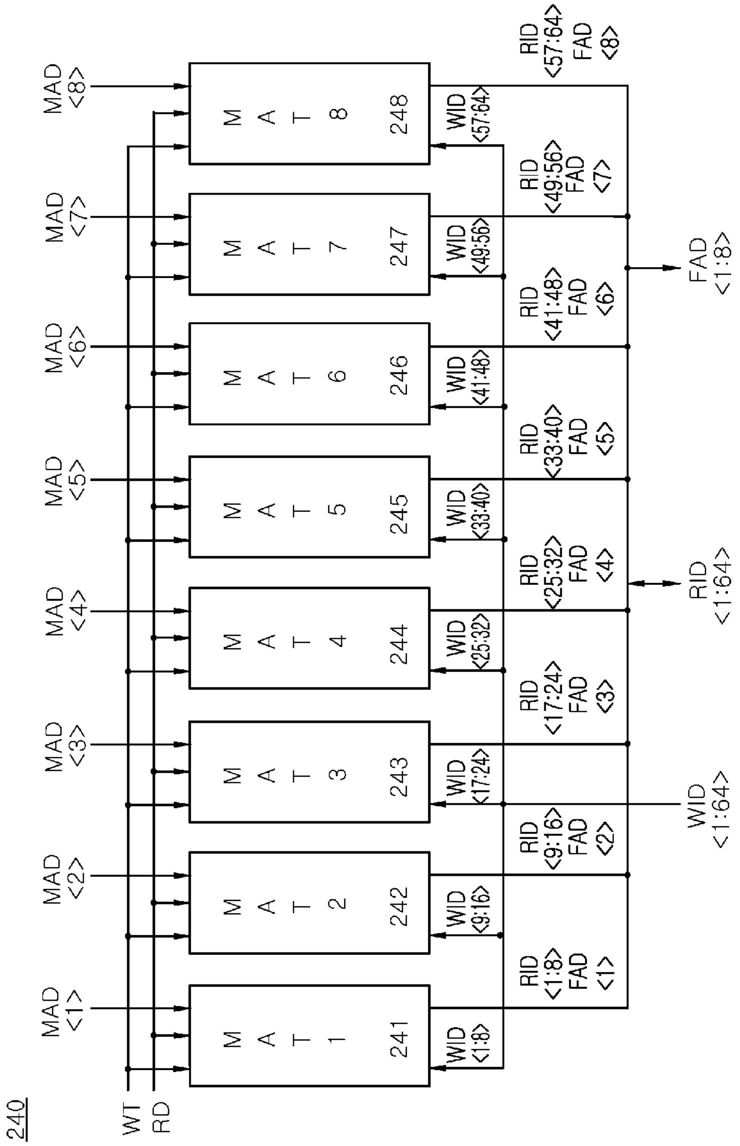
FIG. 7 is a block diagram illustrating an example of a memory circuit of the semiconductor device illustrated in FIG. 2.

FIG. 7 is a block diagram illustrating an example of the memory circuit 240 of the semiconductor device 20 illustrated in FIG. 2. As illustrated in FIG. 7, the memory circuit 240 includes the first mat 241, the second mat 242, the third mat 243, the fourth mat 244, the fifth mat 245, the sixth mat 246, the seventh mat 247, and the eighth mat 248.

The first mat 241 is selected when the write command WT is enabled and the first mat address MAD<1> is enabled after the start of a write operation during a normal operation, a data bus inversion operation, and a test operation mode operation, and stores the first through eighth bits WID<1:8> of the write data. The first mat 241 is selected when the read command RD is enabled and the first mat address MAD<1> is enabled after the start of a read operation during a normal operation, a data bus inversion operation, and a test operation mode operation, and outputs the first through eighth bits WID<1:8> of the write data that are stored as the first through eighth bits RID<1:8> of the read data. The first mat 241 is selected when the read command RD is enabled and the first mat address MAD<1> is enabled after the start of a read operation during a test operation mode operation, and outputs the first fail address FAD<1> including error information of the first through eighth bits RID<1:8> of the read data. The first mat 241 may be implemented to include an error correction circuit (not illustrated) and may output the first fail address FAD<1> including error information of the first through eighth bits RID<1:8> of the read data.

The second mat 242 is selected when the write command WT is enabled and the second mat address MAD<2> is enabled after the start of a write operation during a normal operation, a data bus inversion operation, and a test operation mode operation, and may store the ninth through sixteenth bits WID<9:16> of the write data. The second mat 242 is selected when the read command RD is enabled and the second mat address MAD<2> is enabled after the start of a read operation during a normal operation, a data bus inversion operation, and a test operation mode operation, and outputs the ninth through sixteenth bits WID<9:16> of the write data, which are stored in the second mat 242, as the ninth through sixteenth bits RID<9:16> of the read data. The second mat 242 is selected when the read command RD is enabled and the second mat address MAD<2> is enabled after the start of a read operation during a test operation mode operation and outputs the second fail address FAD<2> including error information of the ninth through sixteenth bits RID<9:16> of the read data. The second mat 242 may be implemented to include an error correction circuit (not illustrated) and may output the second fail address FAD<2> including error information of the ninth through sixteenth bits RID<9:16> of the read data.

The third mat 243 through the eighth mat 248 input and output the write data WID<17:64> and the read data RID<17:64> and output the third through eighth fail addresses FAD<3:8>, respectively, by each performing the same operation as each of the first mat 241 and the second mat 242, as described in the previous paragraphs.

FIG. 8 is a table showing fail location information based on the fail address according to an embodiment of the present disclosure.

An operation including generating fail location information when an error of one bit (1BIT) occurs in the first through sixty-fourth bits RID<1:64> of the read data and including the controller 10 detecting a mat in which a fail has occurred may be described as follows.

When an error of one bit (1BIT) occurs, among the first through eighth bits RID<1:8> of the read data that are output by the first mat 241, the first mat 241 outputs the first fail address FAD<1> at a logic high level H. At this time, the second through eighth fail addresses FAD<2:8> having a logic low level L are output.

The fail location information generation circuit 350 generates the first fail location information FAIF<1> having a logic high level H, the second fail location information FAIF<2> having a logic low level L, the third fail location information FAIF<3> having a logic low level L, and the fourth fail location information FAIF<4> having a logic low level L by encoding the first through eighth fail addresses FAD<1:8> when the flag signal FLAG is enabled after the start of a read operation during a test operation mode operation.

The controller 10 detects that a fail has occurred in the first mat 241 by detecting or reading the first through fourth pieces of fail location information FAIF<1:4>.

When an error of one bit (1BIT) occurs, among the ninth to sixteenth bits RID<9:16> of the read data that are output by the second mat 242, the second mat 242 outputs the second fail address FAD<2> at a logic high level H. At this time, the first fail address FAD<1> having a logic low level L and the third through eighth fail addresses FAD<3:8> having a logic low level L are output.

The fail location information generation circuit 350 generates the first fail location information FAIF<1> having a logic low level L, the second fail location information FAIF<2> having a logic high level H, the third fail location information FAIF<3> having a logic low level L, and the fourth fail location information FAIF<4> having a logic low level L by encoding the first through eighth fail addresses FAD<1:8> when the flag signal FLAG is enabled after the start of a read operation during a test operation mode operation.

The controller 10 detects that a fail has occurred in the second mat 242 by detecting or reading the first through fourth pieces of fail location information FAIF<1:4>.

When an error of one bit (1BIT) occurs, among the seventeenth to twenty-fourth bits RID<17:24> of the read data that are output by the third mat 243, the third mat 243 outputs the third fail address FAD<3> at a logic high level H. At this time, the first and second fail addresses FAD<1:2> and the fourth through eighth fail addresses FAD<4:8> each having a logic low level L are output.

The fail location information generation circuit 350 generates the first fail location information FAIF<1> having a logic high level H, the second fail location information FAIF<2> having a logic high level H, the third fail location information FAIF<3> having a logic low level L, and the fourth fail location information FAIF<4> having a logic low level L by encoding the first through eighth fail addresses FAD<1:8> when the flag signal FLAG is enabled after the start of a read operation during a test operation mode operation.

The controller 10 detects that a fail has occurred in the third mat 243 by detecting or reading the first through fourth pieces of fail location information FAIF<1:4>.

When an error of one bit (1BIT) occurs, among the twenty-fifth to thirty-second bits RID<25:32> of the read data that are output by the fourth mat 244, the fourth mat 244 outputs the fourth fail address FAD<4> at a logic high level H. At this time, the first through third fail addresses FAD<1:3> and the fifth through eighth fail addresses FAD<5:8> each having a logic low level L are output.

The fail location information generation circuit 350 generates the first fail location information FAIF<1> having a logic low level L, the second fail location information FAIF<2> having a logic low level L, the third fail location information FAIF<3> having a logic high level H, and the fourth fail location information FAIF<4> having a logic low level L by encoding the first through eighth fail addresses FAD<1:8> when the flag signal FLAG is enabled after the start of a read operation during a test operation mode operation.

The controller 10 detects that a fail has occurred in the fourth mat 244 by detecting or reading the first through fourth pieces of fail location information FAIF<1:4>.

When an error of one bit (1BIT) occurs, among the thirty-third to fortieth bits RID<33:40> of the read data that are output by the fifth mat 245, the fifth mat 245 outputs the fifth fail address FAD<5> at a logic high level H. At this time, the first through fourth fail addresses FAD<1:4> and the sixth through eighth fail addresses FAD<6:8> each having a logic low level L are output.

The fail location information generation circuit 350 generates the first fail location information FAIF<1> having a logic high level H, the second fail location information FAIF<2> having a logic low level L, the third fail location information FAIF<3> having a logic high level H, and the fourth fail location information FAIF<4> having a logic low level L by encoding the first through eighth fail addresses FAD<1:8> when the flag signal FLAG is enabled after the start of a read operation during a test operation mode operation.

The controller 10 detects that a fail has occurred in the fifth mat 245 by detecting or reading the first through fourth pieces of fail location information FAIF<1:4>.

When an error of one bit (1BIT) occurs, among the forty-first through forty-eighth bits RID<41:48> of the read data that are output by the sixth mat 246, the sixth mat 246 outputs the sixth fail address FAD<6> at a logic high level H. At this time, the first through fifth fail addresses FAD<1:5> and the seventh and eighth fail addresses FAD<7:8> each having a logic low level L are output.

The fail location information generation circuit 350 generates the first fail location information FAIF<1> having a logic low level L, the second fail location information FAIF<2> having a logic high level H, the third fail location information FAIF<3> having a logic high level H, and the fourth fail location information FAIF<4> having a logic low level L by encoding the first through eighth fail addresses FAD<1:8> when the flag signal FLAG is enabled after the start of a read operation during a test operation mode operation.

The controller 10 detects that a fail has occurred in the sixth mat 246 by detecting or reading the first through fourth pieces of fail location information FAIF<1:4>.

When an error of one bit (1BIT) occurs, among the forty-ninth to fifty-sixth bits RID<49:56> of the read data that are output by the seventh mat 247, the seventh mat 247 outputs the seventh fail address FAD<7> at a logic high level H. At this time, the first through sixth fail addresses FAD<1:6> and the eighth fail address FAD<8> each having a logic low level L are output.

The fail location information generation circuit 350 generates the first fail location information FAIF<1> having a logic high level H, the second fail location information FAIF<2> having a logic high level H, the third fail location information FAIF<3> having a logic high level H, and the fourth fail location information FAIF<4> having a logic low level L by encoding the first through eighth fail addresses FAD<1:8> when the flag signal FLAG is enabled after the start of a read operation during a test operation mode operation.

The controller 10 detects that a fail has occurred in the seventh mat 247 by detecting or reading the first through fourth pieces of fail location information FAIF<1:4>.

When an error of one bit (1BIT) occurs, among the fifty-seventh to sixty-fourth bits RID<57:64> of the read data that are output by the eighth mat 248, the eighth mat 248 outputs the eighth fail address FAD<8> having a logic high level H. At this time, the first through seventh fail addresses FAD<1:7> each having a logic low level L are output.

The fail location information generation circuit 350 generates the first fail location information FAIF<1> having a logic low level L, the second fail location information FAIF<2> having a logic low level L, the third fail location information FAIF<3> having a logic low level L, and the fourth fail location information FAIF<4> having a logic high level H by encoding the first through eighth fail addresses FAD<1:8> when the flag signal FLAG is enabled after the start of a read operation during a test operation mode operation.

The controller 10 detects that a fail has occurred in the eighth mat 248 by detecting or reading the first through fourth pieces of fail location information FAIF<1:4>.

An operation including generating fail location information when an error does not occur in the first through sixty-fourth bits RID<1:64> of the read data (NO ERROR) and detecting, by the controller 10, no mat in which a fail has occurred may be described as follows.

When an error does not occur (NO ERROR) in the read data RID<1:64> that are output by the first mat 241 through the eighth mat 248, the first mat 241 through the eighth mat 248 outputs the first through eighth fail addresses FAD<1:8> each having a logic low level L.

The fail location information generation circuit 350 generates the first through fourth pieces of fail location information FAIF<1:4> each at a logic high level H by encoding the first through eighth fail addresses FAD<1:8> when the flag signal FLAG is enabled after the start of a read operation during a test operation mode operation.

The controller 10 detects that an error has not occurred in the first mat 241 through eighth mat 248 by detecting or reading the first through fourth pieces of fail location information FAIF<1:4>.

An operation including an error occurring in the seventeenth to twenty-fourth bits RID<17:24> of the read data that are output by the third mat 243 and an error occurring in the forty-first through forty-eighth bits RID<41:48> of the read data that are output by the sixth mat 246, and including detecting, by the controller 10, a mat in which a fail has occurred may be described as follows.

When an error of one bit (1BIT) occurs, among the seventeenth to twenty-fourth bits RID<17:24> of the read data that are output by the third mat 243, the third mat 243 outputs the third fail address FAD<3> at a logic high level H.

When an error of one bit (1BIT) occurs, among the forty-first through forty-eighth bits RID<41:48> of the read data that are output by the sixth mat 246, the sixth mat 246 outputs the sixth fail address FAD<6> at a logic high level H. At this time, the first and second fail addresses FAD<1:2>, the fourth and fifth fail addresses FAD<4:5>, and the seventh and eighth fail addresses FAD<7:8> each having a logic low level L are output.

The fail location information generation circuit 350 generates the first through fourth pieces of fail location information FAIF<1:4> each having a logic low level L by encoding the first through eighth fail addresses FAD<1:8> when the flag signal FLAG is enabled after the start of a read operation during a test operation mode operation.

In this example, the controller 10 might not detect the locations of the mats in which a fail has occurred in the first mat 241 through the eighth mat 248 by detecting or reading the first through fourth pieces of fail location information FAIF<1:4>.

An operation including an error occurring in the first through eighth bits RID<1:8> of the read data that are output by the first mat 241, an error occurring in the thirty-third to fortieth bits RID<33:40> of the read data that are output by the fifth mat 245, and an error occurring in the fifty-seventh to sixty-fourth bits RID<57:64> of the read data that are output by the eighth mat 248, and including detecting, by the controller 10, a mat in which a fail has occurred may be described as follows.

When an error of one bit (1BIT) occurs, among the first through eighth bits RID<1:8> of the read data that are output by the first mat 241, the first mat 241 outputs the first fail address FAD<1> at a logic high level H.

When an error of one bit (1BIT) occurs, among the thirty-third to fortieth bits RID<33:40> of the read data that are output by the fifth mat 245, the fifth mat 245 outputs the fifth fail address FAD<5> at a logic high level H.

When an error of one bit (1BIT) occurs, among the fifty-seventh to sixty-fourth bits RID<57:64> of the read data that are output by the eighth mat 248, the eighth mat 248 outputs the eighth fail address FAD<8> at a logic high level H. At this time, the second through fourth fail addresses FAD<2:4> and the sixth and seventh fail addresses FAD<6:7> each having a logic low level L are output.

The fail location information generation circuit 350 generates the first through fourth pieces of fail location information FAIF<1:4> each having a logic low level L by encoding the first through eighth fail addresses FAD<1:8> when the flag signal FLAG is enabled after the start of a read operation during a test operation mode operation.

In this example, the controller 10 might not detect the location of a mat in which a fail has occurred in the first mat 241 through eighth mat 248 by detecting or reading the first through fourth pieces of fail location information FAIF<1:4>.

As described above, the semiconductor system 1 according to the embodiment of the present disclosure generates the fail location information FAIF<1:4> when the pattern data PD<1:64> and the read data RID<1:64> are different and detects the location of a mat in which a fail has occurred based on the fail location information FAIF<1:4>, after the start of a read operation by using the data processing circuit 230 for performing a data bus inversion operation. The semiconductor system 1 inputs and outputs data by inverting the data when the logic levels (bits) of data that are input and output during a previous operation and the logic levels (bits) of data that are currently input and output are different from each other by a set quantity or more during a data bus inversion operation. The semiconductor system 1 may reduce current consumption by inverting or not inverting data when performing a data bus inversion operation when inputting and outputting the data.

Figure 9:
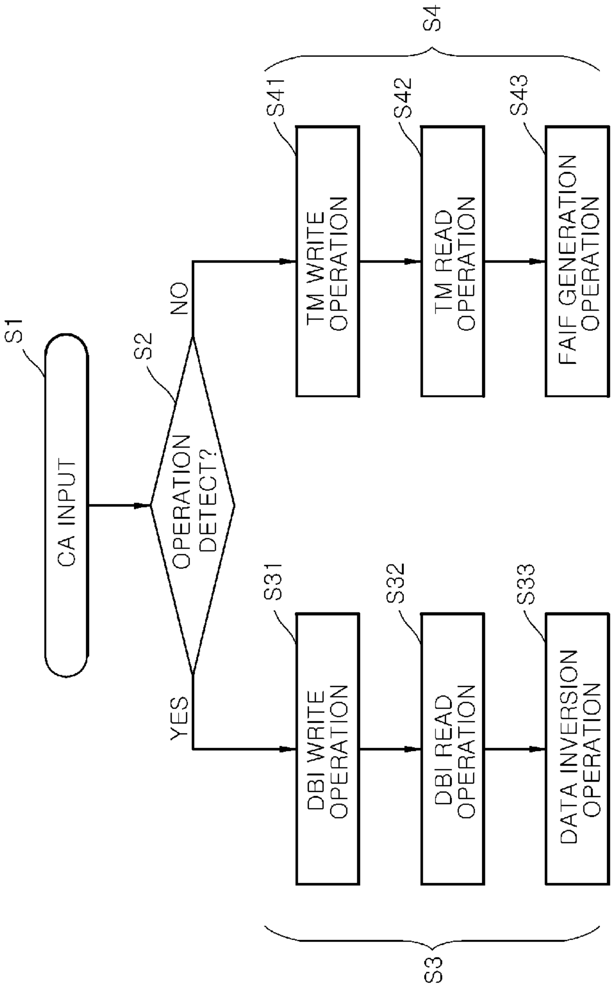
FIG. 9 is a flowchart illustrating a data output method of the semiconductor system according to an embodiment of the present disclosure.

FIG. 9 is a flowchart illustrating a data output method of the semiconductor system according to an embodiment of the present disclosure. As illustrated in FIG. 9, the data output method includes a command address (CA) input operation S1, an operation detection determination S2, a data bus inversion operation S3, and a test operation mode operation S4.

The command address input operation S1 may include outputting, by the controller 10, the command address CA<1:6> and receiving, by the semiconductor device 20, the command address CA<1:6> in synchronization with the clock CLK signal.

The operation detection determination S2 includes detecting or determining whether a data bus inversion operation or a test operation mode operation is to be performed based on the command address CA<1:6>. When the data bus inversion operation is detected S2 (YES), the command generation circuit 210 generates the data bus inversion command DBI for performing the data bus inversion operation by decoding the first group CA<1:3> of the command address in synchronization with the clock CLK signal. When the test operation mode operation is detected S2 (NO), the command generation circuit 210 generates the test mode command TM for performing the test operation mode operation by decoding the first group CA<1:3> of the command address in synchronization with the clock CLK signal.

When the data bus inversion operation is detected S2 (YES), the command generation circuit 210 decodes the first group CA<1:3> of the command address in synchronization with the clock CLK signal. When the data bus inversion command DBI for performing the data bus inversion operation is enabled, the data bus inversion operation S3 is entered. When the test operation mode operation is detected S2 (NO), the command generation circuit 210 decodes the first group CA<1:3> of the command address in synchronization with the clock CLK signal. When the test mode command TM for performing the test operation mode operation is enabled, the test operation mode operation S4 is entered.

The data bus inversion operation S3 includes a data bus inversion write operation S31, a data bus inversion read operation S32, and a data inversion operation S33.

The data bus inversion write operation S31 is performed when the data bus inversion operation is detected (YES). The data bus inversion write operation S31 includes generating the write data WID<1:64> by receiving the data DATA<1:64> when the write command WT is enabled and storing the write data WID<1:64> in the first mat 241 through the eighth mat 248 that are selected by the first through eighth mat addresses MAD<1:8> that are all enabled. During the data bus inversion write operation S31, the command generation circuit 210 generates the data bus inversion command DBI for performing the data bus inversion operation by decoding the first group CA<1:3> of the command address in synchronization with the clock CLK signal and generating the write command WT for performing a write operation by decoding the first group CA<1:3> of the command address. During the data bus inversion write operation S31, the address generation circuit 220 generates the first through eighth mat addresses MAD<1:8> that are all enabled when the data bus inversion command DBI is enabled. During the data bus inversion write operation S31, the data processing circuit 230 outputs the second data DATA<1:64> as the write data WID<1:64> by inverting or not inverting the second data DATA<1:64> based on a comparison between the first data DATA<1:64> and the second data DATA<1:64> after the start of write operations that are consecutively performed during the data bus inversion operation. During the data bus inversion write operation S31, the memory circuit 240 stores the write data WID<1:64> when all of the first mat 241 through the eighth mat 248 are selected after the start of a write operation during the data bus inversion operation.

The data bus inversion read operation S32 includes outputting, as the read data RID<1:64>, the write data WID<1:64> that are stored in the first mat 241 through the eighth mat 248 that are selected by the first through eighth mat addresses MAD<1:8> that are all enabled when the read command RD is enabled. During the data bus inversion read operation S32, the command generation circuit 210 generates the data bus inversion command DBI for performing the data bus inversion operation by decoding the first group CA<1:3> of the command address in synchronization with the clock CLK signal and generates the read command RD for performing a read operation based on the first group CA<1:3> of the command address. During the data bus inversion read operation S32, the address generation circuit 220 generates the first through eighth mat addresses MAD<1:8> that are all enabled when the data bus inversion command DBI is enabled. During the data bus inversion read operation S32, the memory circuit 240 outputs, as the first read data RID<1:64> and the second read data RID<1:64>, the first write data WID<1:64> and the second write data WID<1:64> that are stored in the first mat 241 through the eighth mat 248 when all of the first mat 241 through the eighth mat 248 are selected after the start of read operations that are consecutively performed during the data bus inversion operation.

The data inversion operation S33 may include outputting the second read data RID<1:64> as the data DATA<1:64> by inverting or not inverting the second read data RID<1:64> based on a comparison between the first read data RID<1:64> and the second read data RID<1:64>. During the data inversion operation S33, the data processing circuit 230 may output the second read data RID<1:64> as the data DATA<1:64> by inverting or not inverting the second read data RID<1:64> based on a comparison between the first read data RID<1:64> and the second read data RID<1:64> after the start of read operations that are consecutively performed during the data bus inversion operation. During the data inversion operation S33, the data processing circuit 230 outputs the second read data RID<1:64> as the data DATA<1:64> by inverting the second read data RID<1:64> when the comparison between the first read data RID<1:64> and the second read data RID<1:64> results in a quantity of differing bits or logic levels that is a set quantity or more. During the data inversion operation S33, the data processing circuit 230 outputs the second read data RID<1:64> as the data DATA<1:64> by not inverting the second read data RID<1:64> when the comparison between the first read data RID<1:64> and the second read data RID<1:64> results in a quantity of differing bits or logic levels less than the set quantity.

The test operation mode operation S4 includes a test mode write operation S41, a test mode read operation S42, and a fail location information generation operation S43.

The test mode write operation S41 is performed when the test operation mode operation is detected (NO). The test mode write operation S41 includes generating the write data WID<1:64> by receiving the same data DATA<1:64> as the pattern data PD<1:64> when the write command WT is enabled and storing the write data WID<1:64> in the first mat 241 through the eighth mat 248 that are selected by the first through eighth mat addresses MAD<1:8> that are all enabled. During the test mode write operation S41, the command generation circuit 210 generates the test mode command TM in order to perform the test operation mode operation by decoding the first group CA<1:3> of the command address in synchronization with the clock CLK signal and generating the write command WT for performing a write operation by decoding the first group CA<1:3> of the command address. During the test mode write operation S41, the address generation circuit 220 generates the first through eighth mat addresses MAD<1:8> that are all enabled when the test mode command TM is enabled. During the test mode write operation S41, the data processing circuit 230 outputs, as the write data WID<1:64>, the same data DATA<1:64> as the pattern data PD<1:64> after the start of write operations that are consecutively performed during the test operation mode operation. During the test mode write operation S41, the memory circuit 240 stores the write data WID<1:64> when all of the first mat 241 through the eighth mat 248 are selected after the start of a write operation during the test operation mode operation.

The test mode read operation S42 includes outputting, as the read data RID<1:64>, the write data WID<1:64> that are stored in the first mat 241 through the eighth mat 248 that are selected by the first through eighth mat addresses MAD<1:8> that are all enabled when the read command RD is enabled. During the test mode read operation S42, the command generation circuit 210 generates the test mode command TM for performing the test operation mode operation by decoding the first group CA<1:3> of the command address in synchronization with the clock CLK signal and generating the read command RD for performing a read operation based on the first group CA<1:3> of the command address. During the test mode read operation S42, the address generation circuit 220 generates the first through eighth mat addresses MAD<1:8> that are all enabled when the test mode command TM is enabled. During the test mode read operation S42, the memory circuit 240 outputs, as the third read data RID<1:64>, the write data WID<1:64> that are stored in the first mat 241 through the eighth mat 248 when all of the first mat 241 through the eighth mat 248 are selected after the start of a read operation during the test operation mode operation. The memory circuit 240 outputs the first through eighth fail addresses FAD<1:8> including error information of the third read data RID<1:64> when all of the first mat 241 through the eighth mat 248 are selected after the start of a read operation during the test operation mode operation.

The fail location information generation operation S43 includes comparing the pattern data PD<1:64> and the third read data RID<1:64> and outputting the first through fourth pieces of fail location information FAIF<1:4> that are generated by encoding the first through eighth fail addresses FAD<1:8> based on a result of the comparison. During the fail location information generation operation S43, the data processing circuit 230 outputs the first through fourth pieces of fail location information FAIF<1:4> that are generated by encoding the first through eighth fail addresses FAD<1:8> when the comparison between the pattern data PD<1:64> and the third read data RID<1:64> results in a non-zero quantity of differing bits or logic levels, for example, at least one bit is different between the pattern data PD<1:64> and the third read data RID<1:64>. During the fail location information generation operation S43, the controller 10 detects a fail location in the first mat 241 through the eighth mat 248 by receiving and reading the first through fourth pieces of fail location information FAIF<1:4> from the semiconductor device 20 during the test operation mode operation.

As described above, in the data output method according to the embodiment of the present disclosure, the fail location information FAIF<1:4> may be generated when the pattern data PD<1:64> and the read data RID<1:64> are different after the start of a read operation by using the data processing circuit 230 for performing a data bus inversion operation. The location of a mat in which a fail has occurred may be detected based on the fail location information FAIF<1:4>. During the data output method, when the comparison of data that are input and output during a previous operation and the data that are currently input and output are different from each other by a set quantity or more during a data bus inversion operation, data may be input and output by inverting the data. The data output method may reduce current consumption by inverting or not inverting data when performing a data bus inversion operation when data are input and output.

Figure 10:
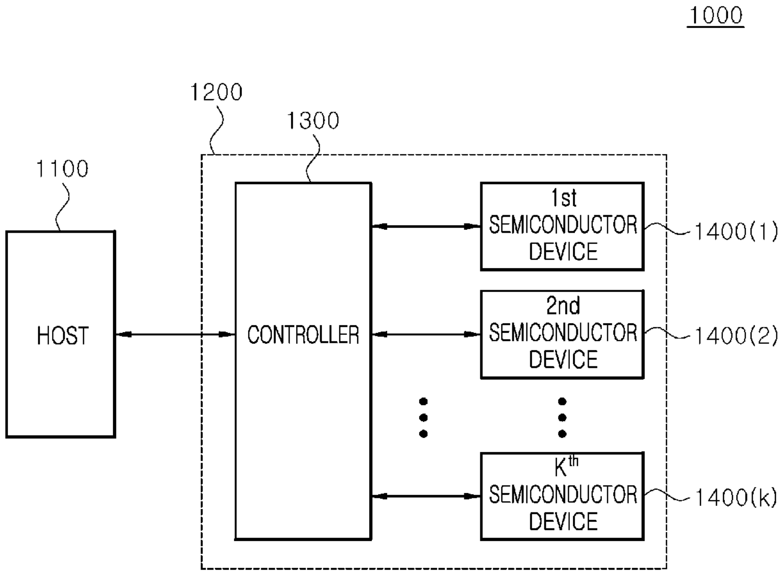
FIG. 10 is a diagram illustrating an electronic system according to an embodiment of the present disclosure.

FIG. 10 is a block diagram illustrating an electronic system 1000 according to an embodiment of the present disclosure. As illustrated in FIG. 10, the electronic system 1000 includes a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), and a universal serial bus (USB).

The semiconductor system 1200 may include a controller 1300 and semiconductor devices 1400 (K:1), where K is an integer. The controller 1300 may control a normal operation, data bus inversion operation, and test operation mode operation of the semiconductor devices 1400 (K:1). The semiconductor devices 1400 (K:1) may each generate the write data WID<1:64> from the data DATA<1:64> after the start of a write operation of a normal operation and may store the write data WID<1:64> in a mat that is selected among the first mat 241 through the eighth mat 248. The semiconductor devices 1400 (K:1) may each generate the data DATA<1:64> from the write data WID<1:64> that are stored in a mat that is selected among the first mat 241 through the eighth mat 248 after the start of a read operation of a normal operation. The semiconductor devices 1400 (K:1) may each output the data DATA<1:64> to the controller 1300 after the start of a read operation of a normal operation. The semiconductor devices 1400 (K:1) may each input and output the data DATA<1:64> by inverting the data DATA<1:64> when the quantity of logic levels of the data DATA<1:64> that are input and output during a previous operation and the quantity of logic levels of the data DATA<1:64> that are currently input and output are different from each other by a set quantity or more during a data bus inversion operation. The semiconductor devices 1400 (K:1) may each reduce current consumption by inverting or not inverting the data DATA<1:64> by performing a data bus inversion operation. The semiconductor devices 1400 (K:1) may each generate the first through fourth pieces of fail location information FAIF<1:4> by using the data processing circuit 230 for performing a data bus inversion operation. The controller 1300 may detect the location of a mat in which a fail has occurred based on the first through fourth pieces of fail location information FAIF<1:4>.

The controller 1300 may be embodied as the controller 10 illustrated in FIG. 1. The semiconductor devices 1400 (K:1) may each be embodied as the semiconductor device 20 illustrated in FIG. 1 and FIG. 2. According to an embodiment, the semiconductor devices 1400 (K:1) may each be implemented as one of dynamic random access memory (DRAM), phase change random access memory (PRAM), resistive random access memory (RRAM), magnetic random access memory (MRAM), ferroelectric random access memory (FRAM), and so forth.

What is claimed is:

1. A semiconductor device comprising:

a memory circuit comprising a plurality of mats and configured to:

output first read data having a data sequence identical to a data sequence of pattern data after a start of a read operation during a test operation mode operation, which is different from a normal operation; and output a fail address comprising error information of the first read data when the pattern data is different from the first read data during the test operation mode operation; and a data processing circuit configured to output the first read data as data and configured to generate fail location information by encoding the fail address.

2. The semiconductor device of claim 1, wherein the memory circuit is configured to store, in the plurality of mats, write data having a data sequence identical to the data sequence of the pattern data during the test operation mode operation.

3. The semiconductor device of claim 1, wherein:

during the test operation mode operation, the plurality of mats each outputs, as the first read data, write data having a data sequence identical to the data sequence of the pattern data after the start of the read operation; and the plurality of mats each outputs the fail address comprising the error information of the first read data.

4. The semiconductor device of claim 1, wherein the data processing circuit comprises:

an input and output sense amplifier configured to generate input data based on the first read data;

a latch circuit configured to generate storage data by storing the pattern data when a test mode command is enabled;

a flag signal generation circuit configured to generate a flag signal after comparing the input data and the storage data;

a data inversion control circuit configured to output the input data as the data when the flag signal is enabled; and a fail location information generation circuit configured to generate the fail location information by encoding the fail address when the flag signal is enabled.

5. The semiconductor device of claim 1, wherein:

the memory circuit is configured to output second read data and third read data that are stored in the plurality of mats by correcting errors of the second read data and the third read data after a start of read operations that are consecutively performed during a data bus inversion operation; and the data processing circuit is configured to output the third read data as the data by inverting the third read data when a comparison between the second read data and the third read data results in a quantity of differing data by a set quantity or more during the data bus inversion operation.

6. The semiconductor device of claim 5, wherein the data processing circuit comprises:

an input and output sense amplifier configured to generate input data based on the second read data and the third read data during the data bus inversion operation;

a latch circuit configured to generate storage data by storing the input data when a data bus inversion command is enabled;

a flag signal generation circuit configured to generate a flag signal as enabled when a comparison between the input data and the storage data results in a quantity of differing data by the set quantity or more; and a data inversion control circuit configured to output, as the data, the input data that are generated from the third read data by inverting the input data when the flag signal is enabled.

7. A semiconductor system comprising:

a controller configured to output a command address during a data bus inversion operation, configured to receive data, configured to output the command address and pattern data during a test operation mode operation, which is different from a normal operation, and configured to receive fail location information; and a semiconductor device configured to output second read data as the data by inverting or not inverting the second read data based on a comparison between first read data and second read data after a start of read operations that are consecutively performed during a data bus inversion operation based on the command address, configured to output third read data as the data after the start of the read operation during the test operation mode operation based on the command address, and configured to output a fail address comprising error information of the third read data as the fail location information by encoding the fail address when the third read data and the pattern data are different.

8. The semiconductor system of claim 7, wherein the controller is configured to detect fail locations within a plurality of mats that are included in the semiconductor device based on the fail location information.

9. The semiconductor system of claim 7, wherein the semiconductor device comprises:

a command generation circuit configured to generate a read command, a data bus inversion command, and a test mode command by decoding at least part of the command address that is input in synchronization with a clock;

an address generation circuit configured to generate a plurality of mat addresses that are all enabled when the data bus inversion command and the test mode command are enabled;

a memory circuit comprising a plurality of mats and configured to output the first read data and the second read data that are stored in the plurality of mats that are selected based on the plurality of mat addresses when the read command is enabled, configured to output the third read data that are stored in the plurality of mats based on the plurality of mat addresses, and configured to output the fail address; and a data processing circuit configured to output the second read data as the data by inverting the second read data when a comparison between the first read data and the second read data results in a quantity of differing data by a set quantity or more when the data bus inversion command is enabled, configured to output the third read data as the data when the test mode command is enabled, and configured to generate the fail location information by encoding the fail address.

10. The semiconductor system of claim 9, wherein the memory circuit is configured to store write data having a data sequence identical to a data sequence of the pattern data during the test operation mode operation.

11. The semiconductor system of claim 9, wherein the data processing circuit is configured to generate the fail location information when the pattern data and the third read data are different during the test operation mode operation.

12. The semiconductor system of claim 9, wherein:
each of the plurality of mats is configured to output the first read data and the second read data after the start of the read operations that are consecutively performed during the data bus inversion operation;
the plurality of mats each is configured to output write data as the third read data after the start of the read operation during the test operation mode operation; and
the plurality of mats each is configured to output the fail address comprising error information of the third read data.

13. The semiconductor system of claim 9, wherein the data processing circuit comprises:
an input and output sense amplifier configured to generate input data based on the data identical with the pattern data that are input after a start of a write operation during the test operation mode operation and configured to generate the input data based on the first read data, the second read data, and the third read data after the start of the read operation;
a latch circuit configured to generate storage data by storing the input data that are generated from the first read data when the data bus inversion command is enabled and configured to generate the storage data by storing the pattern data when the test mode command is enabled;
a flag signal generation circuit configured to generate a flag signal by comparing the input data and the storage data based on the data bus inversion command and the test mode command;
a data inversion control circuit configured to generate write data from the input data after a start of a write operation during the test operation mode operation, configured to output the input data as the data by inverting the input data when the flag signal is enabled after the start of the read operation during the data bus inversion operation, and configured to output the input data as the data when the flag signal is enabled after the start of the read operation during the test operation mode operation; and
a fail location information generation circuit configured to generate the fail location information by encoding the fail address when the flag signal is enabled.

14. The semiconductor system of claim 13, wherein the flag signal generation circuit comprises:
a comparison circuit configured to generate comparison data by comparing the input data and the storage data after the start of the read operation during the data bus inversion operation and the test operation mode operation; and
a detection circuit configured to generate the flag signal as enabled when the comparison data has a quantity of differing data that is a preset quantity or more when the data bus inversion command is enabled and configured to generate the flag signal as enabled when the comparison data indicates differing data when the test mode command is enabled.

15. A data output method comprising:
detecting which of a data bus inversion operation and a test operation mode operation is to be performed based on a command address;
performing a data bus inversion operation including: generating write data by receiving data after a start of a write operation based on the command address, storing the write data in a plurality of mats based on a plurality of mat addresses that are all enabled, and outputting, as the data, first read data and second read data that are output from the write data by one of inverting and not inverting the first read data and the second read data after a start of a read operation; and
performing a test operation mode operation, which is different from a normal operation, including: generating the write data by receiving the data identical with pattern data after the start of the write operation based on the command address, storing the write data in the plurality of mats, and outputting, as fail location information, third read data that are output from the write data and a fail address comprising error information of the third read data by encoding the third read data and the fail address after the start of the read operation.

16. The data output method of claim 15, wherein:
the data bus inversion operation is performed when a data bus inversion command is enabled by decoding at least part of the command address; and
the test operation mode operation is performed when a test mode command is enabled by decoding at least part of the command address.

17. The data output method of claim 15, wherein the data bus inversion operation comprises:
a data bus inversion write operation including generating the write data by receiving the data when a write command is enabled by decoding at least part of the command address and storing the write data in a mat that is selected by the plurality of mat addresses that are all enabled;
a data bus inversion read operation including outputting, as the first read data and the second read data, the write data that are stored in the mat that is selected by the plurality of mat addresses that are all enabled when a read command is enabled by decoding at least part of the command address; and
a data inversion operation including outputting the second read data as the data by one of inverting and not inverting the second read data based on a comparison between the first read data and the second read data.

18. The data output method of claim 17, wherein in the data inversion operation, the second read data are output as the data by inverting the second read data when a comparison between the first read data and the second read data results in a quantity of differing data by a set quantity or more.

19. The data output method of claim 15, wherein the test operation mode operation comprises:
a test mode write operation including generating the write data by receiving the data identical with the pattern data when a test mode command is enabled by decoding a first group of the command address and storing the write data in a mat that is selected by the plurality of mat addresses that are all enabled;
a test mode read operation including outputting the third read data and a fail address comprising error information of the third read data from the write data that are stored in the mat that is selected by the plurality of mat addresses that are all enabled when a read command is enabled by decoding at least part of the command address; and
performing fail location information generation including comparing the pattern data and the third read data and outputting the fail location information that is generated by encoding the fail address based on a result of the comparison.

20. The data output method of claim 19, wherein the fail location information generation includes ouputting the fail location information that is generated by encoding the fail address when a comparison between bits that are included in the pattern data and bits that are included in the third read data results in at least one different bit.

21. A method comprising:

comparing first read data and pattern data resulting in comparison data; and when the first read data is different from the pattern data, performing a test operation mode operation, which is different from a normal operation, including: outputting the first read data, outputting a fail address comprising error information of the first read data, and generating fail location information by encoding the fail address.

22. The method of claim 21, further comprising performing a data bus inversion operation including comparing first read data and second read data resulting in comparison data and outputting the first read data and second read data by one of inverting and not inverting the first read data and the second read data based on the comparison data after a start of a read operation.

* * * * *